United States Patent
Kim et al.

(10) Patent No.: US 12,284,868 B2
(45) Date of Patent: Apr. 22, 2025

(54) DISPLAY DEVICE INCLUDING AN ANTIREFLECTION LAYER DISPOSED BETWEEN AN ORGANIC LIGHT EMITTING DIODE AND A THIN FILM ENCAPSULATION LAYER

(71) Applicant: Samsung Display Co., Ltd., Yongin-Si (KR)

(72) Inventors: Wooyoung Kim, Yongin-si (KR); Ohjeong Kwon, Hwaseong-si (KR); Junghan Seo, Hwaseong-si (KR); Hongyeon Lee, Suwon-si (KR); Seungyeon Jeong, Hwaseong-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 582 days.

(21) Appl. No.: 17/470,430

(22) Filed: Sep. 9, 2021

(65) Prior Publication Data

US 2022/0209204 A1 Jun. 30, 2022

(30) Foreign Application Priority Data

Dec. 31, 2020 (KR) .......................... 10-2020-0189370

(51) Int. Cl.
*H01L 51/52* (2006.01)
*H10K 50/844* (2023.01)
*H10K 50/86* (2023.01)
*H10K 71/00* (2023.01)

(52) U.S. Cl.
CPC ......... *H10K 50/865* (2023.02); *H10K 50/844* (2023.02); *H10K 71/00* (2023.02)

(58) Field of Classification Search
CPC .... H10K 50/865; H10K 50/844; H10K 71/00; H10K 50/858; H10K 50/86; H10K 50/8445; H10K 59/122; H10K 59/12; H10K 2102/351
See application file for complete search history.

(56) References Cited

U.S. PATENT DOCUMENTS

| | | | |
|---|---|---|---|
| 9,048,459 B2 | 6/2015 | Cho et al. | |
| 9,692,018 B2 | 6/2017 | Cho et al. | |
| 9,947,429 B2 | 4/2018 | Shida et al. | |
| 10,608,207 B2 | 3/2020 | Ju et al. | |
| 2011/0242376 A1* | 10/2011 | Ando | H01L 27/14685 257/E31.127 |
| 2013/0234115 A1* | 9/2013 | Song | H10K 50/86 257/40 |
| 2014/0002901 A1* | 1/2014 | Kishi | G02B 5/0221 359/488.01 |

(Continued)

FOREIGN PATENT DOCUMENTS

| | | |
|---|---|---|
| KR | 1020110049477 A | 12/2011 |
| KR | 1020140056498 A | 5/2014 |

(Continued)

*Primary Examiner* — Anh D Mai
(74) *Attorney, Agent, or Firm* — CANTOR COLBURN LLP

(57) ABSTRACT

A display device includes an organic light emitting diode emitting light, an antireflection layer disposed on the organic light emitting diode and preventing reflection of external light incident from an outside, and a thin film encapsulation layer disposed on the antireflection layer.

8 Claims, 13 Drawing Sheets

(56) References Cited

U.S. PATENT DOCUMENTS

| | | | | |
|---|---|---|---|---|
| 2014/0014909 A1* | 1/2014 | Lee | .................... | H10K 59/8731 |
| | | | | 438/34 |
| 2016/0329521 A1* | 11/2016 | Kim | .................... | H10K 50/858 |
| 2017/0317315 A1* | 11/2017 | Yang | .................... | G06F 3/0412 |
| 2018/0013100 A1* | 1/2018 | Yim | .................... | H10K 50/8445 |
| 2018/0040847 A1* | 2/2018 | Lee | .................... | H10K 59/879 |
| 2018/0203554 A1* | 7/2018 | Cho | .................... | H10K 59/131 |
| 2019/0198587 A1* | 6/2019 | Park | .................... | H10K 50/84 |
| 2019/0326555 A1* | 10/2019 | Yang | .................... | C23C 16/50 |
| 2020/0266382 A1* | 8/2020 | Seo | .................... | H10K 85/351 |
| 2021/0200361 A1* | 7/2021 | Park | .................... | G06F 3/0412 |
| 2022/0208902 A1* | 6/2022 | Kim | .................... | H10K 59/88 |
| 2022/0285653 A1* | 9/2022 | Tian | .................... | H10K 50/846 |
| 2023/0171991 A1* | 6/2023 | He | .................... | H10K 50/844 |
| | | | | 257/40 |

FOREIGN PATENT DOCUMENTS

| | | |
|---|---|---|
| KR | 1020160013102 A | 2/2016 |
| KR | 1020160031108 A | 3/2016 |
| KR | 1020170103060 A | 9/2017 |
| KR | 1020180031884 A | 3/2018 |
| KR | 101862606 B1 | 7/2018 |

\* cited by examiner

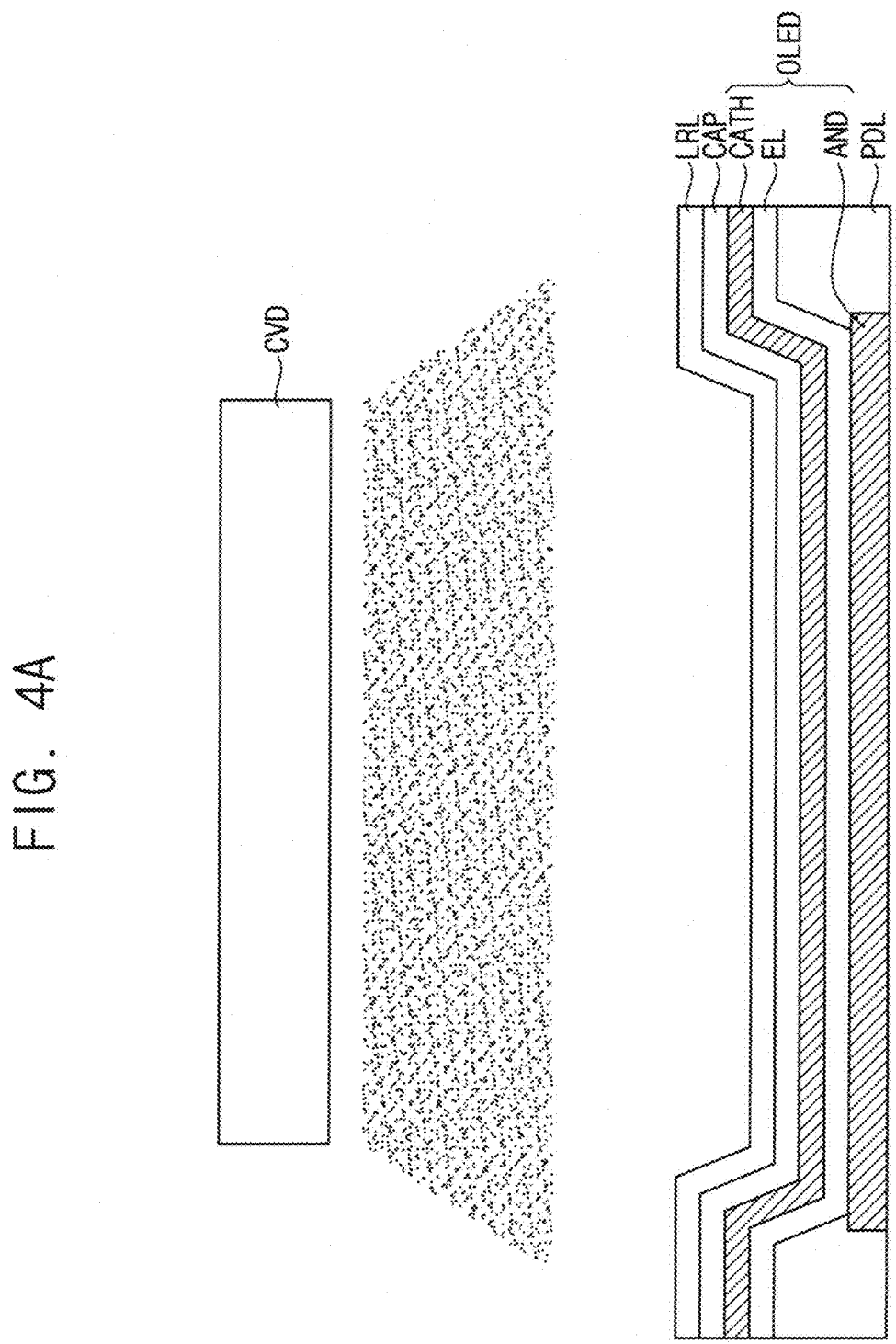

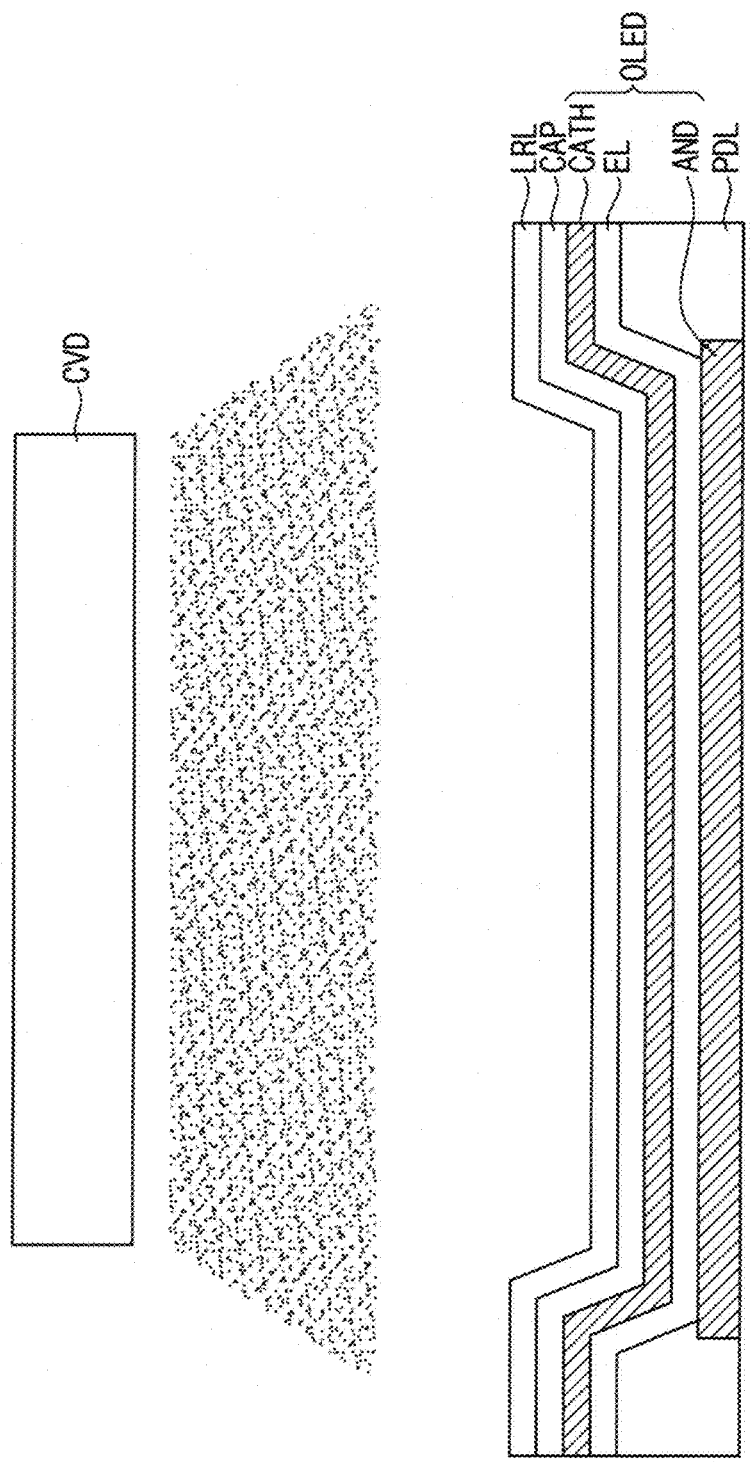

DISPLAY DEVICE INCLUDING AN ANTIREFLECTION LAYER DISPOSED BETWEEN AN ORGANIC LIGHT EMITTING DIODE AND A THIN FILM ENCAPSULATION LAYER

This application claims priority to Korean Patent Application No. 10-2020-0189370 filed on Dec. 31, 2020, and all the benefits accruing therefrom under 35 U.S.C. § 119, the content of which in its entirety is herein incorporated by reference.

BACKGROUND

1. Field

Embodiments relate to a display device. More particularly, embodiments relate to a display device including a thin film encapsulation layer and a method of manufacturing the display device.

2. Description of the Related Art

Display devices are manufactured and used in various types. The display devices are manufactured and used as an organic light emitting display device, a liquid crystal display device, or the like, for example.

The display devices may display an image on a screen and provide the image to a user. In this case, as external light incident on the display device is reflected from the surface of the display device, the display quality of the display device may be deteriorated. In order to prevent such deterioration, a polarizing film, a color filter, and the like are used. In addition to this, research is being conducted to suppress reflection of external light.

SUMMARY

Embodiments provide a display device including a thin film encapsulation layer.

Embodiments provide a method of manufacturing a display device including a thin film encapsulation layer.

A display device may include an organic light emitting diode emitting light, an antireflection layer disposed on the organic light emitting diode and preventing reflection of external light incident from an outside and a thin film encapsulation layer disposed on the antireflection layer.

In an embodiment, the antireflection layer may include a first surface and a second surface opposite to the first surface and facing the organic light emitting diode, the external light incident on the antireflection layer may be reflected from the first surface and reflected as first light, the external light incident on the antireflection layer may be reflected from the second surface and reflected as second light, and a phase of the first light and a phase of the second light may be opposite to each other.

In an embodiment, the antireflection layer may include ytterbium (Yb).

In an embodiment, the antireflection layer may include bismuth (Bi).

In an embodiment, the thin film encapsulation layer may include a first inorganic encapsulation layer, a second inorganic encapsulation layer disposed on the first inorganic encapsulation layer, an organic encapsulation layer disposed on the second inorganic encapsulation layer and a third inorganic encapsulation layer disposed on the organic encapsulation layer.

In an embodiment, the first inorganic encapsulation layer may include silicon nitride and the second inorganic encapsulation layer includes silicon oxynitride.

In an embodiment, the third inorganic encapsulation layer may include silicon nitride.

In an embodiment, the display device may further include a substrate on which the organic light emitting diode is disposed such that a thickness of the first inorganic encapsulation layer in a direction perpendicular to a main plane extension direction of the substrate may be about 50 angstroms (Å) to about 150 Å, a thickness of the second inorganic encapsulation layer may be about 9,000 Å about 11,000 Å, a thickness of the organic encapsulation layer may be about 3 micrometers (μm) to about 5 μm, and a thickness of the third inorganic encapsulation layer may be about 6,000 Å to about 8,000 Å.

In an embodiment, the first inorganic encapsulation layer may prevent oxidation of the antireflection layer.

In an embodiment, the first to third inorganic encapsulation layers may be chemical vapor deposition treated layers.

In an embodiment, the display device may further include a capping layer disposed between the organic light emitting diode and the antireflection layer.

A method of manufacturing a display device may include forming an organic light emitting diode on a substrate, forming an antireflection layer on the organic light emitting diode, forming a first inorganic encapsulation layer including silicon nitride on the antireflection layer, forming a second inorganic encapsulation layer including silicon oxynitride on the first inorganic encapsulation layer and forming an organic encapsulation layer on the second inorganic encapsulation layer.

In an embodiment, the antireflection layer may include ytterbium (Yb).

In an embodiment, the antireflection layer may include bismuth (Bi).

In an embodiment, the method may further include forming a third inorganic encapsulation layer including silicon nitride on the organic encapsulation layer.

In an embodiment, a thickness of the first inorganic encapsulation layer in a direction perpendicular to a main plane extension direction of the substrate may be about 50 Å to about 150 Å, a thickness of the second inorganic encapsulation layer may be about 9,000 Å to about 11,000 Å, a thickness of the organic encapsulation layer may be about 3 μm to about 5 μm, and a thickness of the third inorganic encapsulation layer may be about 6,000 Å to about 8,000 Å.

In an embodiment, the antireflection layer may include a first upper surface and a second lower surface opposite to the first surface and facing the organic light emitting diode, the external light incident on the antireflection layer may be reflected from the first surface and reflected as first light, the external light incident on the antireflection layer may be reflected from the second surface and reflected as second light, and a phase of the first light and a phase of the second light may be opposite to each other.

In an embodiment, the first inorganic encapsulation layer and the second inorganic encapsulation layer may be formed by chemical vapor deposition and the first inorganic encapsulation layer may prevent the antireflection layer from being oxidized during the forming the second inorganic encapsulation layer.

In an embodiment, the method may further include before the forming the antireflection layer, forming a capping layer on the organic light emitting diode.

The display device in the embodiment may include the organic light emitting diode emitting light, the antireflection layer disposed on the organic light emitting diode and preventing reflection of external light incident from the outside, and the thin film encapsulation layer disposed on the antireflection layer.

Accordingly, in the display device, reflection of external light from the antireflection layer may be suppressed, so that display quality may be improved.

BRIEF DESCRIPTION OF THE DRAWINGS

Illustrative, non-limiting embodiments will be more clearly understood from the following detailed description taken in conjunction with the accompanying drawings.

FIGS. 4A and 4B are diagrams illustrating an embodiment of a method of manufacturing a display device.

FIGS. 5A to 5F are diagrams illustrating an embodiment of a method of manufacturing a display device.

DETAILED DESCRIPTION

Figure 1:
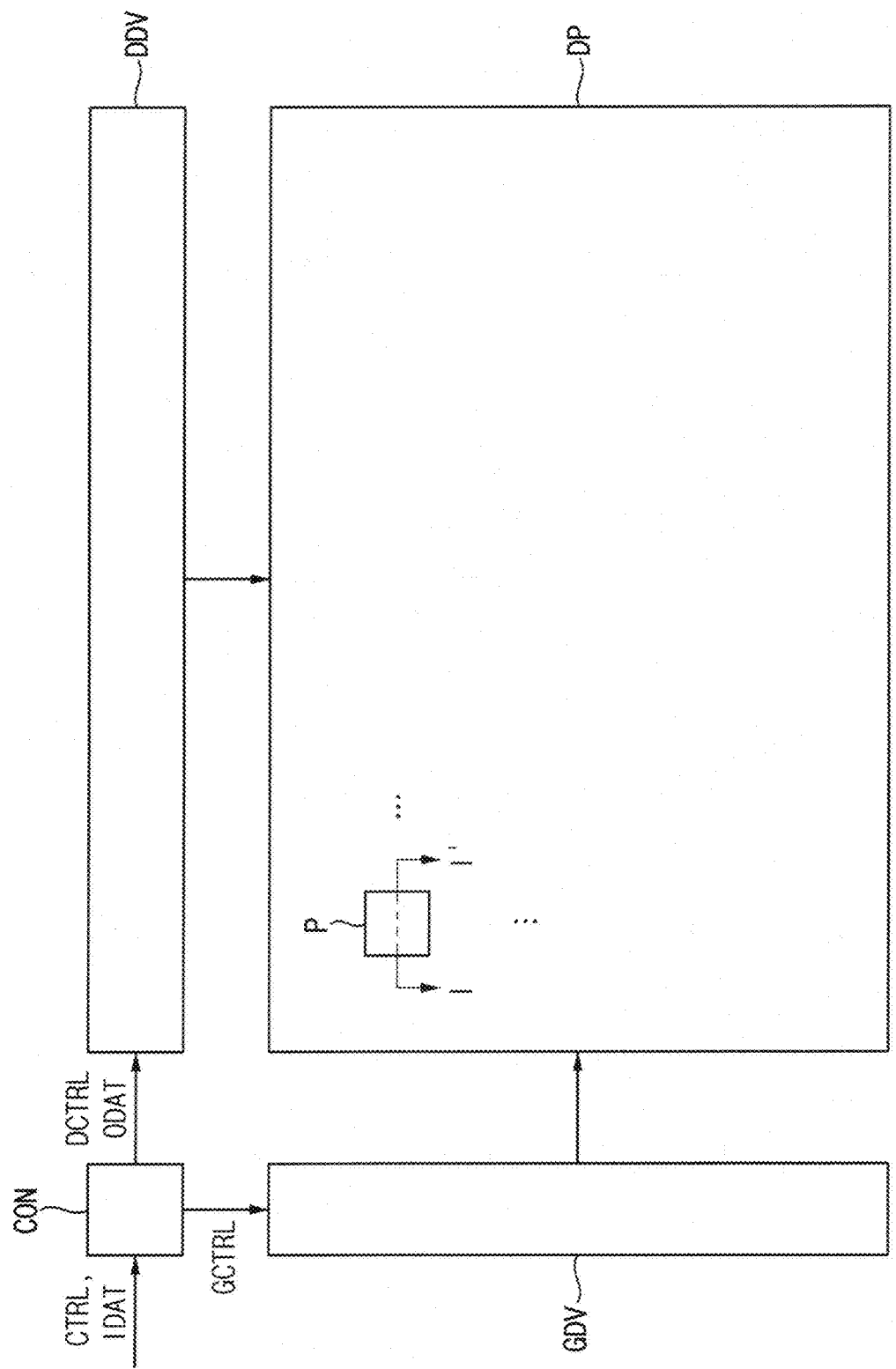
FIG. 1 is a block diagram illustrating an embodiment of a display device.

Hereinafter, backlight units and display devices in embodiments will be explained in detail with reference to the accompanying drawings.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this invention will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

FIG. 1 is a block diagram illustrating an embodiment of a display device.

Referring to FIG. 1, the display device may include a display panel DP including a plurality of pixels P, a data driver DDV, a gate driver GDV, and a timing controller CON.

The display device may display an image through the display panel DP. To this end, the display panel DP may include the pixels P and light emitting diodes connected to the pixels P. In an embodiment, the display panel DP may be configured as a single panel. In an alternative embodiment, in embodiments, the display panel DP may be configured by connecting a plurality of panels.

The timing controller CON may generate a gate control signal GCTRL, a data control signal DCTRL, and output image data ODAT based on a control signal CTRL and input image data IDAT provided from the outside. In an embodiment, the control signal CTRL may include a vertical synchronization signal, a horizontal synchronization signal, an input data enable signal, a master clock signal, or the like, for example. In an embodiment, the input image data IDAT may be RGB data including red image data, green image data, and blue image data, for example. In an alternative embodiment, the input image data IDAT may include magenta image data, cyan image data, and yellow image data.

The gate driver GDV may generate gate signals based on the gate control signal GCTRL provided from the timing controller CON. In an embodiment, the gate control signal GCTRL may include a vertical start signal, a clock signal, or the like, for example. In an embodiment, the gate driver GDV may be manufactured as a separate panel and connected to the display panel DP. The gate driver GDV is electrically connected to the display panel DP and may sequentially output the gate signals. Each of the pixels P may receive a data voltage according to the control of each of the gate signals.

The data driver DDV may generate the data voltage based on the data control signal DCTRL and the output image data ODAT provided from the timing controller CON. In an embodiment, the data control signal DCTRL may include an output data enable signal, a horizontal start signal, and a load signal, for example. In an embodiment, the data driver DDV may be manufactured as a separate panel and electrically connected to the display panel DP. The data driver DDV is electrically connected to the display panel DP and may generate a plurality of data voltages. Each of the pixels P may transmit a signal for luminance corresponding to each of the data voltages to the light emitting diodes.

Figure 2:
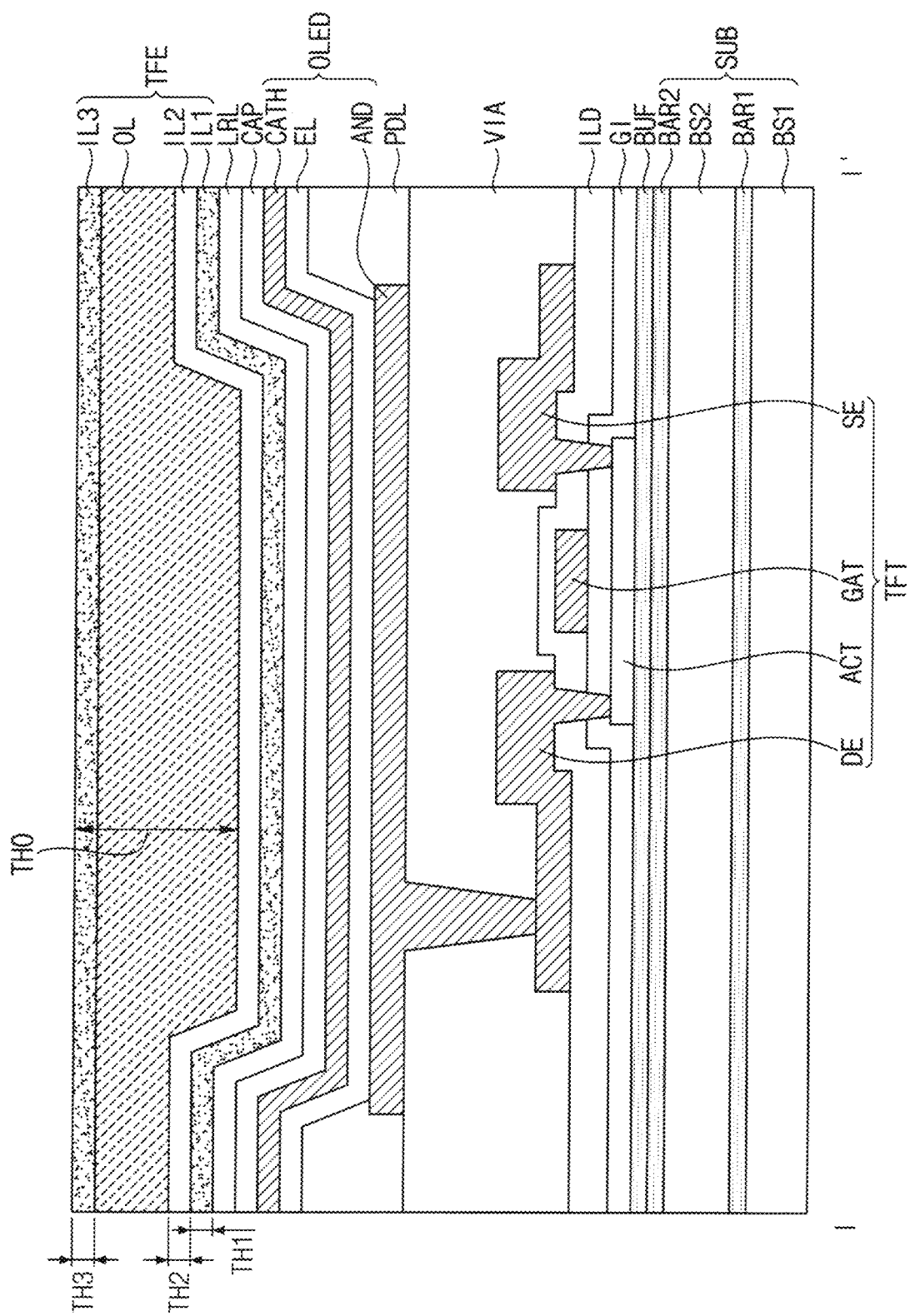
FIG. 2 is a cross-sectional view illustrating an embodiment of a cross-section taken along line I-I' of FIG. 1.

FIG. 2 is a cross-sectional view illustrating an embodiment of a cross-section taken along line I-I' of FIG. 1.

Referring to FIGS. 1 and 2, the display device may include a substrate SUB, a buffer layer BUF, a gate insulating layer GI, an inter-insulating layer ILD, a via-insulating layer VIA, a transistor TFT, a pixel defining layer PDL, and an organic light emitting diode OLED, a capping layer CAP, an antireflection layer LRL, and a thin film encapsulation layer TFE.

The transistor TFT may include an active layer ACT, a gate electrode GAT, a source electrode SE, and a drain electrode DE. The organic light emitting diode OLED may include an anode electrode AND, a light emitting layer EL, and a cathode electrode CATH. The thin film encapsulation layer TFE may include a first inorganic encapsulation layer IL1, a second inorganic encapsulation layer IL2, an organic encapsulation layer OL, and a third inorganic encapsulation layer IL3.

The substrate SUB may include a plurality of layers. In an embodiment, the substrate SUB may have a structure in which a first base substrate BS1, a first barrier layer BAR1, a second base substrate BS2, and a second barrier layer BAR2 are stacked, for example.

In an embodiment, the first base substrate BS1 may have rigid characteristics. In this case, the first base substrate BS1 may include glass, quartz, or the like. In addition, in embodiments, the first base substrate BS1 may have a flexible characteristic. In this case, the first base substrate BS1 may include plastic or the like. In an embodiment, the first base substrate BS1 may include polyimide, for example.

The first barrier layer BAR1 may be disposed on the first base substrate BS1. The first barrier layer BAR1 may include an organic material and/or an inorganic material. In an embodiment, the first barrier layer BAR1 may include silicon oxide (SiOx), silicon nitride (SiNx), silicon oxynitride (SiOxNy), or the like. The first barrier layer BAR1 may prevent diffusion of impurities from the first base substrate BS1 to the transistor TFT. In addition, the first barrier layer BAR1 may protect the transistor TFT from external impact.

The second base substrate BS2 may be disposed on the first barrier layer BAR1. The second base substrate BS2 may include substantially the same material as that of the first base substrate BS1.

The second barrier layer BAR2 may be disposed on the second base substrate BS2. The second barrier layer BAR2 may include substantially the same material as that of the first barrier layer BAR1.

The buffer layer BUF may be disposed on the second barrier layer BAR2. In an embodiment, the buffer layer BUF may include silicon oxide (SiOx), silicon nitride (SiNx), silicon oxynitride (SiOxNy), or the like, for example. The buffer layer BUF may prevent metal atoms or impurities from being diffused into the active layer ACT. In addition, the buffer layer BUF may control the speed of heat provided to the active layer ACT during a crystallization process for forming the active layer ACT.

The active layer ACT may be disposed on the buffer layer BUF. In an embodiment, the active layer ACT may include a silicon semiconductor. In an embodiment, the active layer ACT may include amorphous silicon, polycrystalline silicon, or the like, for example. In an alternative embodiment, in embodiments, the active layer ACT may include an oxide semiconductor. In an embodiment, the active layer ACT may include indium-gallium-zinc oxide ("IGZO"), indium-gallium oxide ("IGO"), and indium-zinc oxide ("IZO"), for example.

The gate insulating layer GI may be disposed on the buffer layer BUF. The gate insulating layer GI may be disposed to cover the active layer ACT. The gate insulating layer GI may include an insulating material. In an embodiment, the gate insulating layer GI may include silicon oxide (SiOx), silicon nitride (SiNx), silicon oxynitride (SiOxNy), or the like, for example.

The gate electrode GAT may be disposed on the gate insulating layer GI. The gate electrode GAT may overlap the active layer ACT. In response to a gate signal provided to the gate electrode GAT, a signal and/or a voltage may flow through the active layer ACT. In an embodiment, the gate electrode GAT may include a metal, an alloy, a metal oxide, a transparent conductive material, or the like. In an embodiment, the gate electrode GAT may include silver (Ag), an alloy including silver, molybdenum (Mo), an alloy including molybdenum, aluminum (Al), an alloy including aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), Scandium (Sc), indium tin oxide ("ITO"), IZO, or the like, for example.

The inter-insulating layer ILD may be disposed on the gate insulating layer GI. The inter-insulating layer ILD may be disposed to cover the gate electrode GAT. In an embodiment, the inter-insulating layer ILD may include an insulating material. In an embodiment, the inter-insulating layer ILD may include silicon oxide (SiOx), silicon nitride (SiNx), silicon oxynitride (SiOxNy), or the like, for example.

The source electrode SE and the drain electrode DE may be disposed on the inter-insulating layer ILD. The source electrode SE and the drain electrode DE may contact the active layer ACT. In an embodiment, the source electrode SE and the drain electrode DE may include a metal, an alloy, a metal oxide, a transparent conductive material, or the like. In an embodiment, the source electrode SE and the drain electrode DE may include silver (Ag), an alloy including silver, molybdenum (Mo), an alloy including molybdenum, aluminum (Al), an alloy including aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), Scandium (Sc), ITO, IZO, or the like, for example.

The via-insulating layer VIA may be disposed on the inter-insulating layer ILD. The via-insulating layer VIA may be disposed to cover the source electrode SE and the drain electrode DE. In an embodiment, the via-insulating layer VIA may include an organic insulating material. Accordingly, the via-insulating layer VIA may have a substantially flat upper surface. In an embodiment, the via-insulating layer VIA may include a photoresist, a polyacrylic resin, a polyimide resin, an acrylic resin, or the like, for example.

The anode electrode AND may be disposed on the via-insulating layer VIA. The anode electrode AND may contact the drain electrode DE. In an embodiment, the anode electrode AND may include a metal, an alloy, a metal oxide, a transparent conductive material, or the like. In an embodiment, the anode electrode AND may include silver (Ag), an alloy including silver, molybdenum (Mo), an alloy including molybdenum, aluminum (Al), an alloy including aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), Scandium (Sc), ITO, IZO, or the like, for example.

The pixel defining layer PDL may be disposed on the via-insulating layer VIA. An opening exposing the anode electrode AND may be defined in the pixel defining layer PDL. In an embodiment, the pixel defining layer PDL may include an organic material. In an embodiment, the pixel defining layer PDL may include a photoresist, a polyacrylic resin, a polyimide resin, an acrylic resin, or the like, for example.

The light emitting layer EL may be disposed on the anode electrode AND. The light emitting layer EL may include an organic material emitting light of a predetermined color. The light emitting layer EL may emit the light based on a potential difference between the anode electrode AND and the cathode electrode CATH.

The cathode electrode CATH may be disposed on the light emitting layer EL. The cathode electrode CATH may include a metal, an alloy, a metal oxide, a transparent conductive material, or the like. In an embodiment, the cathode electrode CATH may include silver (Ag), an alloy including silver, molybdenum (Mo), an alloy including molybdenum, aluminum (Al), an alloy including aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), Scandium (Sc), ITO, IZO, or the like, for example.

The capping layer CAP may be disposed on the cathode electrode CATH. The capping layer CAP may include an organic layer and an inorganic layer.

The organic layer may be disposed along the profile of the cathode electrode CATH. Accordingly, the organic layer may improve light extraction efficiency of the light emitted from the light emitting layer EL. In an embodiment, the organic layer may include organic materials such as a-NPD, NPB, TPD, m-MTDATA, $Alq_3$, or CuPc.

The inorganic layer may be disposed on the organic layer. The inorganic layer may protect the organic layer from external impact. The inorganic layer may include lithium fluoride (LiF).

The antireflection layer LRL may be disposed on the capping layer CAP. External light may enter the display device. The external light may be dissipated in the antireflection layer LRL. In an embodiment, the antireflection layer LRL may offset the external light by a phase difference of the external light reflected from the antireflection layer LRL. In an embodiment, the external light may be divided into a first light reflected from an upper surface of the antireflection layer LRL and a second light reflected from a lower surface of the antireflection layer LRL, for example. Phases of the first light and the second light may be opposite to each other. Accordingly, since the first light and the second light offset each other and disappear, the external light reflected from the outside may not be visually recognized. Accordingly, the display quality of the display device may be improved. In an embodiment, since the external light is not reflected, the display device may effectively display a black image, for example.

In an embodiment, the antireflection layer LRL may include ytterbium (Yb). In an alternative embodiment, in embodiments, the antireflection layer LRL may include bismuth (Bi). In addition, the antireflection layer LRL may include aluminum (Al), silver (Ag), magnesium (Mg), chromium (Cr), titanium (Ti), nickel (Ni), gold (Au), tantalum (Ta), copper (Cu), calcium (Ca), cobalt (Co), iron (Fe), molybdenum (Mo), tungsten (W), platinum (Pt), or the like. In an alternative embodiment, the antireflection layer LRL may include silicon oxide, titanium oxide, zirconium oxide, tantalum oxide, hafnium oxide, aluminum oxide, zinc oxide, yttrium oxide, beryllium oxide, magnesium oxide, lead oxide, tungsten oxide, silicon nitride, lithium fluoride, calcium fluoride, magnesium fluoride, or the like.

The thin film encapsulation layer TFE may be disposed on the antireflection layer LRL. The first inorganic encapsulation layer IL1 may be disposed on the antireflection layer LRL. The first inorganic encapsulation layer IL1 may include silicon nitride (SiNx). The second inorganic encapsulation layer IL2 may be disposed on the first inorganic encapsulation layer IL1. The second inorganic encapsulation layer IL2 may include silicon oxynitride (SiNxOy). The organic encapsulation layer OL may be disposed on the second inorganic encapsulation layer IL2. The organic encapsulation layer OL may have a flat upper surface. The organic encapsulation layer OL may be disposed relatively thicker than the inorganic encapsulation layers IL1, IL2, and IL3. The organic encapsulation layer OL may include a photoresist, a polyacrylic resin, a polyimide resin, an acrylic resin, or the like. The third inorganic encapsulation layer IL3 may be disposed on the organic encapsulation layer OL. The third inorganic encapsulation layer IL3 may include silicon nitride (SiNx).

The first to third inorganic encapsulation layers IL1, IL2, and IL3 may prevent oxygen, moisture, or the like from penetrating into the display device. Accordingly, the organic light emitting diode OLED may be protected. In addition, the first to third inorganic encapsulation layers IL1, IL2, and IL3 may protect the display device from external impact.

In an embodiment, a thickness TH1 of the first inorganic encapsulation layer IL1 in a direction (e.g., vertical direction in FIG. 2) perpendicular to a main plane extension direction (e.g., horizontal direction in FIG. 2) of the first base substrate BS1 may be about 50 angstroms (Å) to about 150 Å, a thickness TH2 of the second inorganic encapsulation layer IL2 may be about 9,000 Å to about 11,000 Å, and a thickness TH3 of the third inorganic encapsulation layer IL3 may be about 6,000 Å to about 8,000 Å.

As described above, the organic encapsulation layer OL may have a relatively thicker thickness than the inorganic encapsulation layers IL1, IL2, and IL3. In an embodiment, a thickness THO of the organic encapsulation layer OL may be about 3 micrometers (μm) to about 5 μm.

In an embodiment, the antireflection layer LRL is formed or provided by thermal evaporation, the first to third inorganic encapsulation layers IL1, IL2, and IL3 are formed or provided by chemical vapor deposition, and the organic encapsulation layer OL may be formed or provided by an inkjet printing process.

In the process of forming the second inorganic encapsulation layer IL2, the antireflection layer LRL may be oxidized by oxygen included in the second inorganic encapsulation layer IL2. Accordingly, without the polarizing film, the antireflection layer LRL for preventing display quality from being deteriorated due to reflection of the external light may not play its original role.

In a process of forming the second inorganic encapsulation layer IL2, the antireflection layer LRL may be oxidized by oxygen included in the second inorganic encapsulation layer IL2. Accordingly, the antireflection layer LRL may not play its original role to preventing display quality from being deteriorated due to reflection of the external light without the polarizing film. In addition, when the antireflection layer LRL is oxidized, a transmittance of the antireflection layer LRL may decrease. Accordingly, display quality of the display device may be deteriorated.

In order to prevent this, the embodiments may prevent oxidation of the antireflection layer LRL by additionally forming the first inorganic encapsulation layer (also referred to as a first inorganic layer) IL1 including silicon nitride (SiNx) before forming the second inorganic encapsulation layer (also referred to as a second inorganic layer) IL2.

Figure 3:
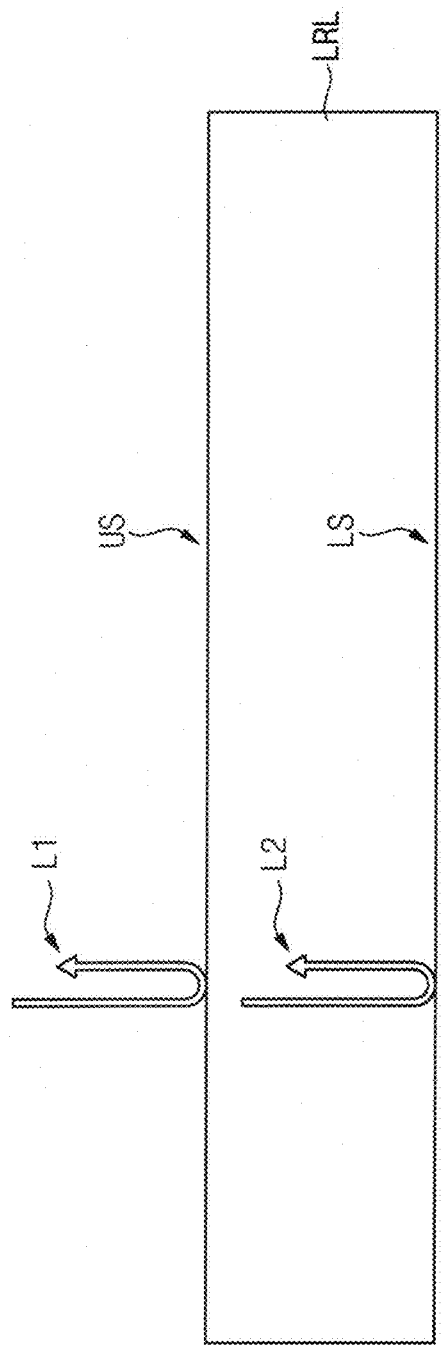
FIG. 3 is a diagram illustrating an embodiment of an antireflection layer included in the display device of FIG. 1.

FIG. 3 is a diagram illustrating an embodiment of an antireflection layer included in the display device of FIG. 1.

Referring to FIG. 3, the antireflection layer LRL may include an upper surface US and a lower surface LS. The antireflection layer LRL may reflect external light incident from the outside. In this case, the external light may be reflected as the first light L1 from the upper surface US. In addition, the external light may be reflected from the lower surface LS as the second light L2. a phase of the first light L1 and a phase of the second light L2 may be opposite to each other. Accordingly, destructive interference may occur between the first light L1 and the second light L2. Accordingly, the first light L1 and the second light L2 may disappear together. Accordingly, the external light reflected by the antireflection layer LRL may not be visually recognized from the outside, and the display device may effectively display a black image.

Figure 4B:
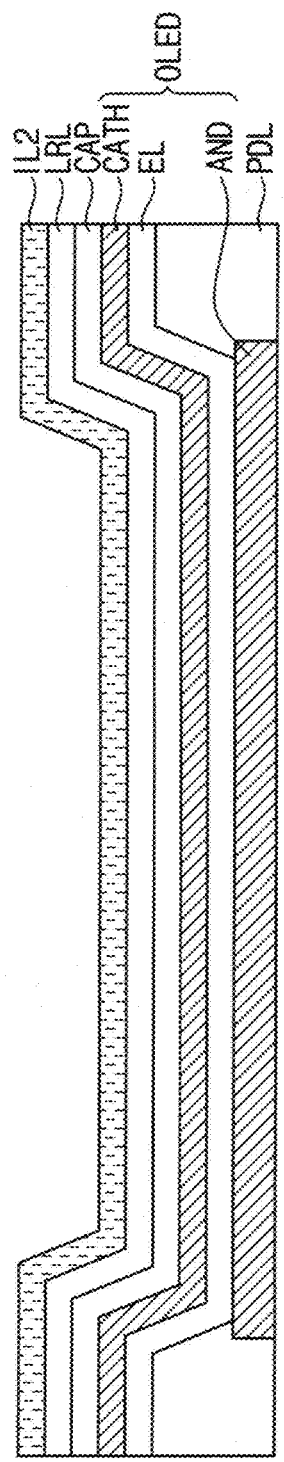
Figure 5B:
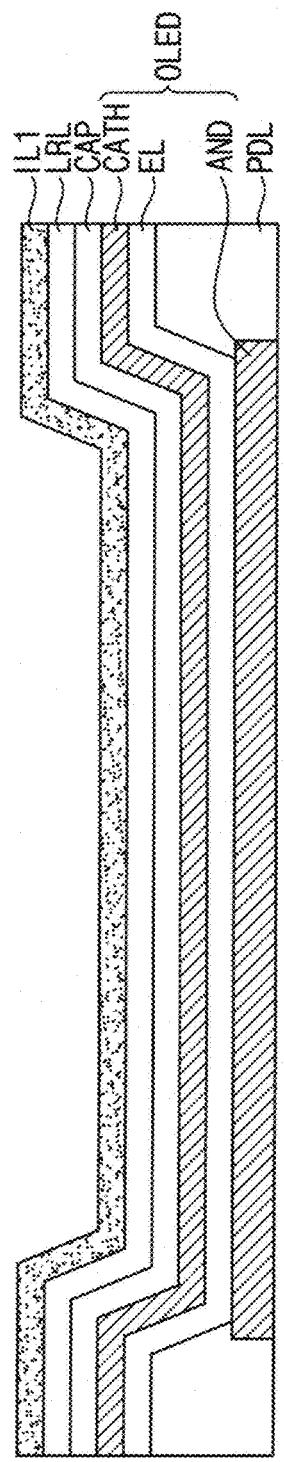
Figure 5C:
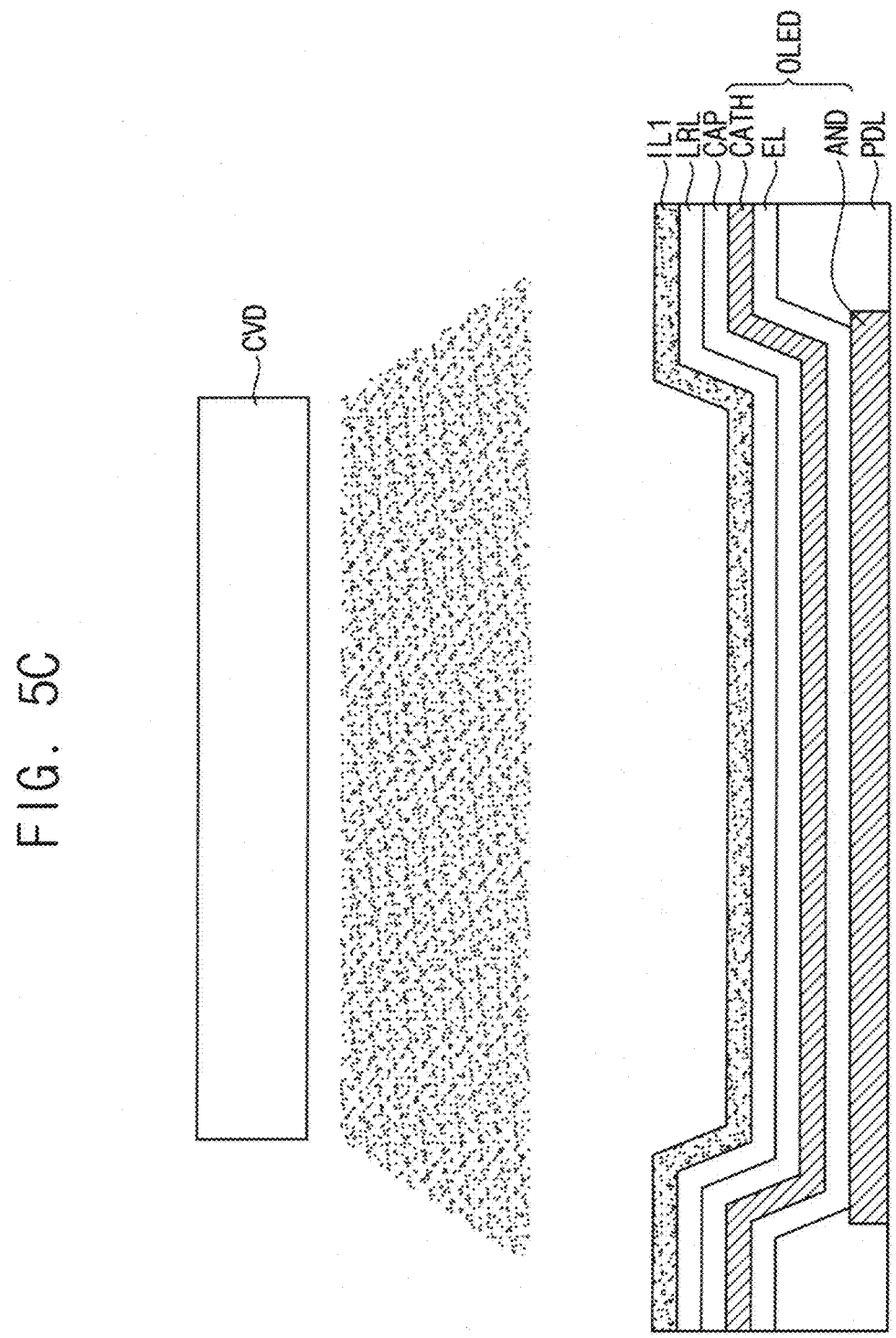
Figure 5D:
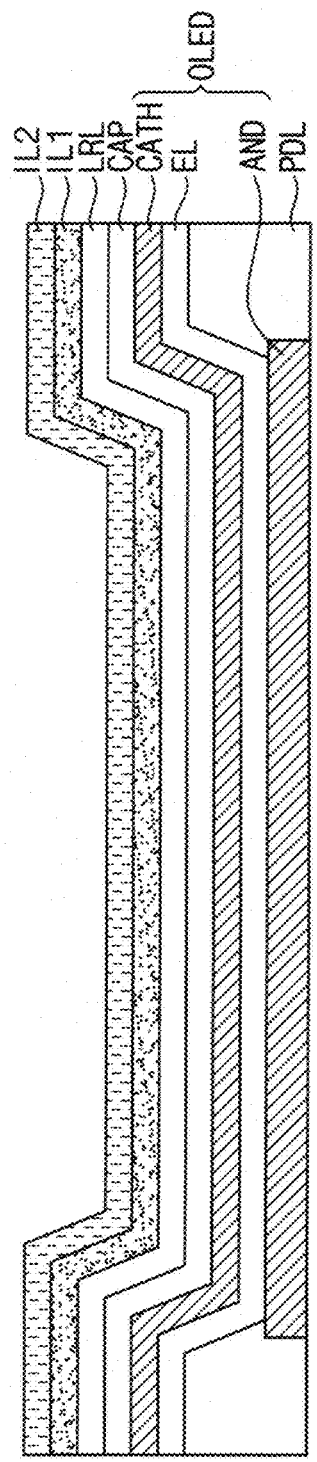
Figure 5E:
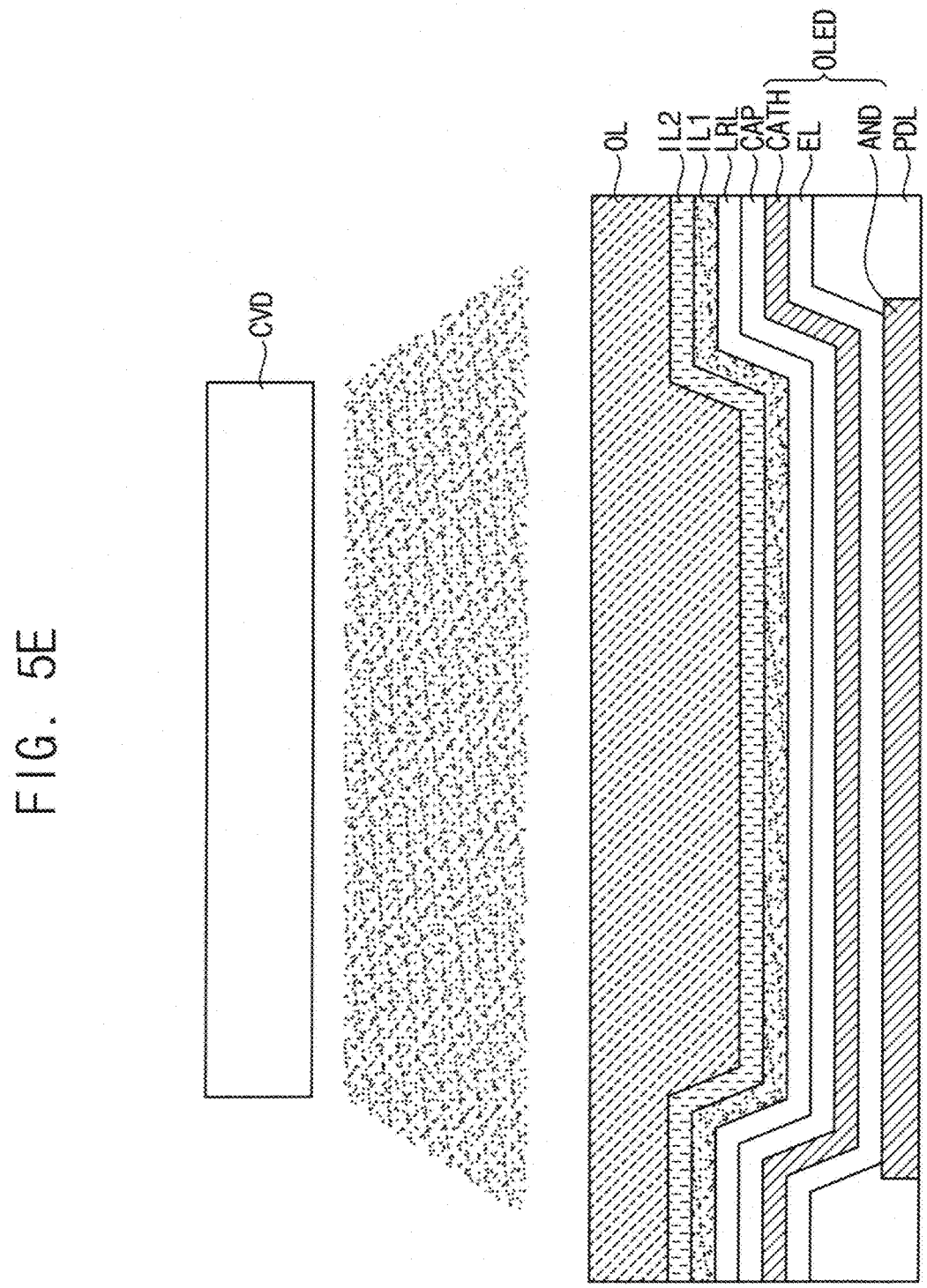
Figure 5F:
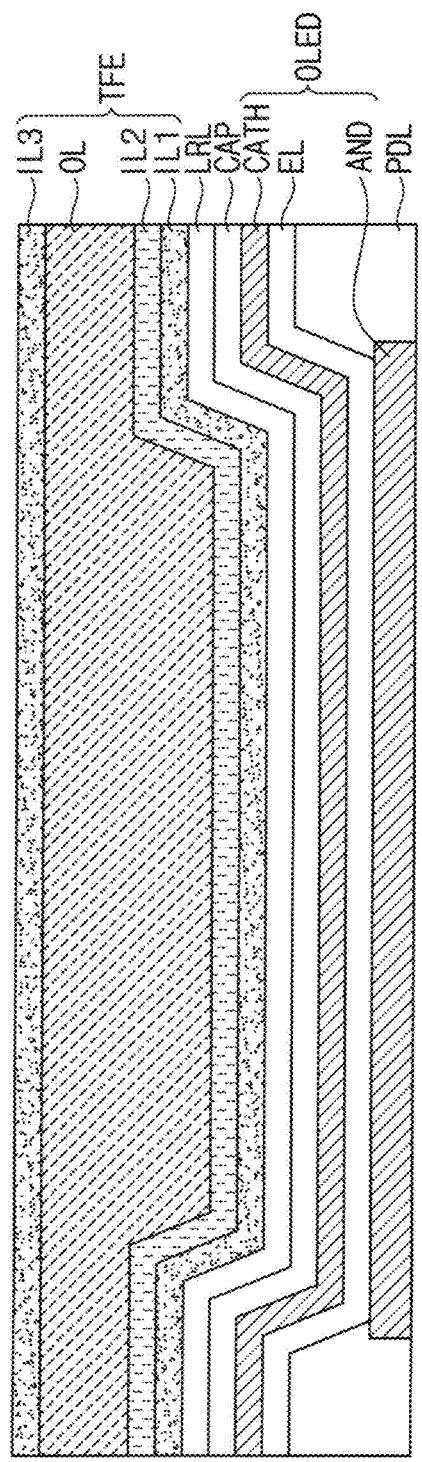

FIGS. 4A and 4B are diagrams illustrating an embodiment of a method of manufacturing a display device.

Referring to FIGS. 2, 4A and 4B, conventionally, a second inorganic encapsulation layer IL2 including silicon oxynitride (SiNxOy) was formed or disposed on the antireflection layer LRL. The second inorganic encapsulation layer IL2 may be deposited by a chemical vapor deposition apparatus CVD. In this case, the chemical vapor deposition apparatus CVD may form the second inorganic encapsulation layer IL2 using silane (SiH$_4$), nitrous oxide (N$_2$O), and ammonia (NH$_3$). In the process of forming the second inorganic encapsulation layer IL2 by chemical vapor deposition, the antireflection layer LRL may be oxidized. In this case, the antireflection layer LRL may not effectively prevent reflection of external light. Therefore, before forming the second inorganic encapsulation layer IL2, it is necessary to form an inorganic encapsulation layer that does not contain oxygen first to prevent the oxidation.

FIGS. 5A to 5F are diagrams illustrating an embodiment of a method of manufacturing a display device.

Referring to FIGS. 2, 5A, 5B, 5C and 5D, the capping layer CAP may be formed or disposed on the organic light emitting diode OLED. The capping layer CAP may be at least one of silicon oxynitride (SiOxNy), silicon nitride (SiNx), zinc oxide (ZnOx), and titanium oxide (TiOx). The capping layer CAP may include at least one of an inorganic material and an organic material. Accordingly, the capping layer CAP may include an inorganic layer or an organic layer, or may include an organic layer including inorganic particles. Inorganic materials usable for the capping layer CAP may include zinc oxide, titanium oxide, zirconium oxide, niobium oxide, tantalum oxide, tin oxide, nickel oxide, silicon nitride, indium nitride, gallium nitride, or the like.

In an embodiment, organic materials usable for the capping layer CAP may be at least one of poly[(3,4-ethylenedioxythiophene)] ("PEDOT"), 4,4'-bis[N-(3-methylphenyl)-N-phenylamino]biphenyl ("TPD"), 4,4',4"-tris[(3-methylphenyl)phenylamino]triphenylamine ("m-MTDATA"), 1,3,5-tris[N,N-bis(2-methylphenyl)-amino]-benzene ("o-MTDAB"), 1,3,4-tris[N,N-bis(3-methylphenyl)-amino]-benzene ("m-MTDAB"), 1,3,5-tris[N,N-bis(4-methylphenyl)-amino]-benzene ("p-MTDAB"), 4,4'-bis[N,N-bis(3-methylphenyl)-amino]-diphenyl Methane ("BPPM"), 4,4'-dicarbazolyl-1,1'-biphenyl ("CBP"), 4,4',4"-tris (N-carbazole) triphenylamine ("TCTA"), 2,2',2"-(1,3,5-benzenetolyl)tris-[1-phenyl-1H-benzoimidazole] ("TPBI"), 3-(4-biphenyl)-4-phenyl-5-t-butylphenyl-1,2,4-triazole ("TAZ"), a-NPD, NPB, TPD, m-MTDATA, Alq3, CuPc, or the like.

In addition, the capping layer CAP may be at least one of LiF, Liq, aluminum(III) bis(2-methyl-8-quinolinato)-4-phenylphenolate (BAlq), and SiOx. The capping layer CAP may include at least one of an inorganic material and an organic material. Accordingly, the capping layer CAP may include an inorganic layer or an organic layer, or may include an organic layer including inorganic particles. Inorganic materials usable for the capping layer CAP may be, for example, silicon oxide and magnesium fluoride. The organic material usable for the capping layer CAP may be acrylic, polyimide, polyamide, and Alq$_3$ [Tris(8-hydroxyquinolinato)aluminium].

In the embodiments, the inorganic material or organic material usable as the capping layer CAP is not limited to the above, and may be appropriately modified into various materials known to those skilled in the art. In an embodiment, the capping layer CAP may include an organic material of low purity, for example. Through this, the capping layer CAP may serve as a high refractive optical auxiliary layer that improves an external light extraction rate.

The antireflection layer LRL may be formed or disposed on the capping layer CAP. The antireflection layer LRL may destructively interfere with each other by a phase difference of external lights reflected from an upper surface and a lower surface, respectively. Through this, the antireflection layer LRL may suppress reflection of external light. In an embodiment, the antireflection layer LRL may be formed or provided by thermal evaporation.

The antireflection layer LRL may include ytterbium (Yb). In an alternative embodiment, in embodiments, the antireflection layer LRL may include bismuth (Bi). In addition, the antireflection layer LRL may include aluminum (Al), silver (Ag), magnesium (Mg), chromium (Cr), titanium (Ti), nickel (Ni), gold (Au), tantalum (Ta), copper (Cu), calcium (Ca), cobalt (Co), iron (Fe), molybdenum (Mo), tungsten (W), platinum (Pt), or the like. In an alternative embodiment, the antireflection layer LRL may include silicon oxide, titanium oxide, zirconium oxide, tantalum oxide, hafnium oxide, aluminum oxide, zinc oxide, yttrium oxide, beryllium oxide, magnesium oxide, lead oxide, tungsten oxide, silicon nitride, lithium fluoride, calcium fluoride, magnesium fluoride, or the like.

The first inorganic encapsulation layer IL1 may be formed or disposed on the antireflection layer LRL. The second inorganic encapsulation layer IL2 may be formed or disposed on the first inorganic encapsulation layer IL1, Since the first inorganic encapsulation layer IL1 includes silicon nitride (SiNx), the antireflection layer LRL may not be oxidized. In addition, when the second inorganic encapsulation layer IL2 is formed or provided, the first inorganic encapsulation layer IL1 may prevent the antireflection layer LRL from being oxidized by oxygen included in the second inorganic encapsulation layer IL2.

Thereafter, the organic encapsulation layer OL and the third inorganic encapsulation layer IL3 may be additionally formed or provided.

In an embodiment, the first to third inorganic encapsulation layers IL1, IL2, and IL3 may be formed or provided by chemical vapor deposition, and the organic encapsulation layer OL may be formed or provided by an inkjet printing process.

Figure 6:
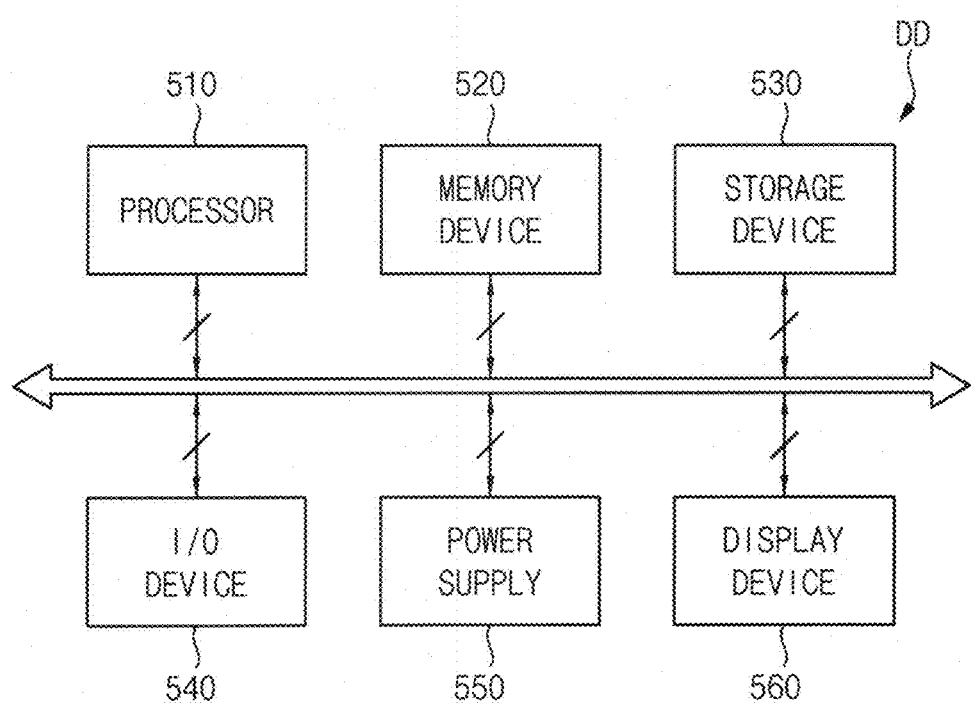
FIG. 6 is a block diagram illustrating an embodiment of an electronic device.
Figure 7:
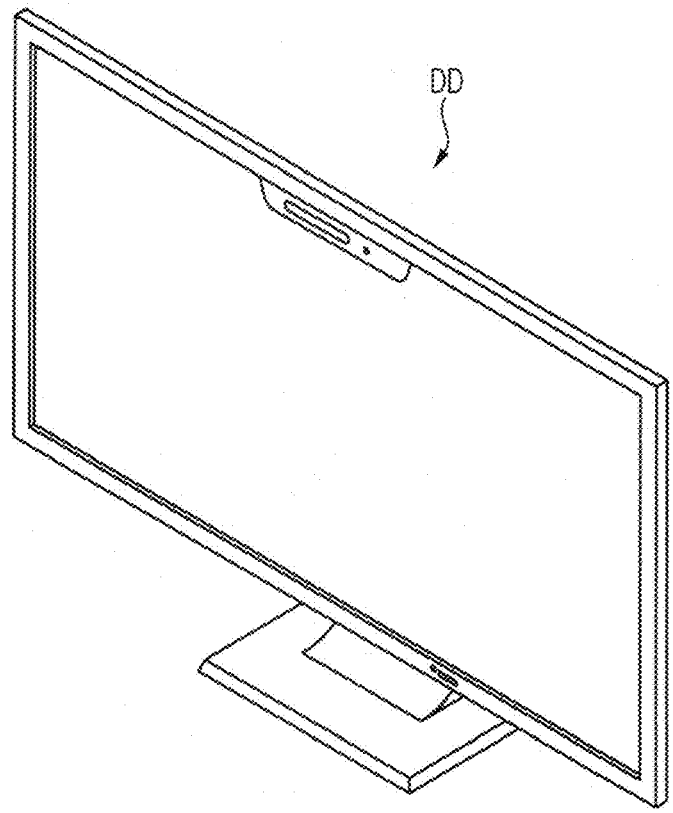
FIG. 7 is a diagram illustrating an embodiment in which the electronic device of FIG. 6 is implemented as a television.
Figure 8:
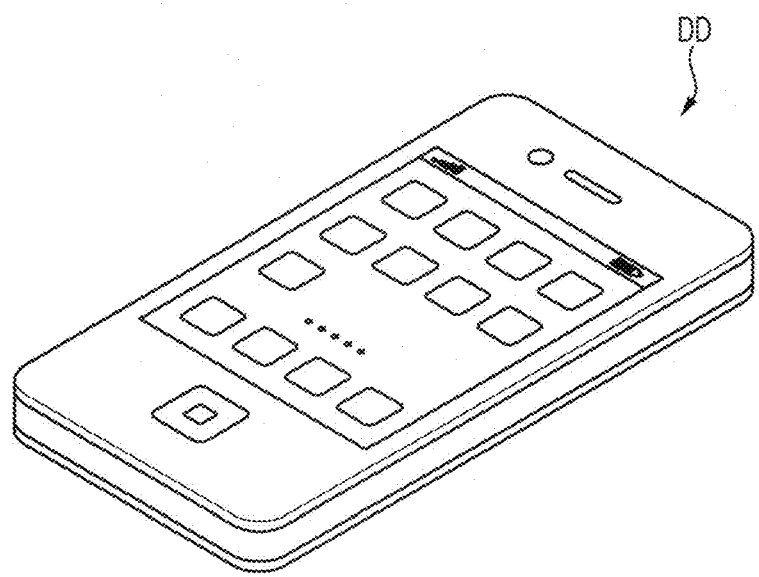
FIG. 8 is a diagram illustrating an embodiment in which the electronic device of FIG. 6 is implemented as a smartphone.

FIG. 6 is a block diagram illustrating an electronic device in an embodiment, FIG. 7 is a diagram illustrating an embodiment in which the electronic device of FIG. 6 is implemented as a television, and FIG. 8 is a diagram illustrating an embodiment in which the electronic device of FIG. 6 is implemented as a smartphone.

Referring to FIGS. 6 to 8, in an embodiment, an electronic device DD includes a processor 510, a memory device 520, a storage device 530, an input/output ("I/O") device 540, a power supply 550, and a display device 560. Here, the display device 560 is a display device of FIG. 1. In addition, the electronic device DD further includes a plurality of ports for communicating with, respectively, a video card, a sound card, a memory card, a universal serial bus ("USB") device, and other electronic devices, etc. In an embodiment, as illustrated in FIG. 7, the electronic device DD is a television. In another embodiment, as illustrated in FIG. 8, the electronic device DD is a smart phone. However, embodiments of the electronic device DD are not limited thereto. In an embodiment, the electronic device DD may be a cellular phone, a video phone, a smart pad, a smart watch, a tablet personal computer ("PC"), a car navigation system, a computer monitor, a laptop, or a head mounted display ("HMD") device, etc., for example.

In an embodiment, the processor 510 performs various computing functions. The processor 510 may be any one of a microprocessor, a central processing unit ("CPU"), or an application processor ("AP"), etc. The processor 510 is coupled to other components via an address bus, a control bus, or a data bus, etc. Further, the processor 510 is coupled to an extended bus such as a peripheral component interconnection ("PCI") bus.

The memory device 520 stores data for operations of the electronic device DD. In an embodiment, the memory device 520 includes at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, or a ferroelectric random access memory ("FRAM") device, etc., or at least one volatile memory device such as a dynamic random access memory ("DRAM") device, a static random access memory ("SRAM") device, or a mobile DRAM device, etc., for example.

In an embodiment, the storage device 530 is one or more of a solid state drive ("SSD") device, a hard disk drive ("HDD") device, or a CD-ROM device, etc. The I/O device 540 includes an input device such as a keyboard, a keypad, a mouse device, a touch-pad, a touch-screen, etc., or an output device such as a printer, a speaker, etc.

The power supply 550 provides power for operations of the electronic device DD. In an embodiment, the display device 560 is coupled to other components via the buses or other communication links. In some embodiments, the I/O device 540 includes the display device 560.

Embodiments of the invention may be incorporated into a display device and an electronic device that includes the display device. In an embodiment, embodiments of the invention may be incorporated into a smart phone, a cellular phone, a video phone, a smart pad, a smart watch, a tablet PC, a car navigation system, a television, a computer monitor, a laptop, or a head mounted display device, etc., for example.

The foregoing is illustrative of embodiments and is not to be construed as limiting thereof. Although a few embodiments have been described, those skilled in the art will readily appreciate that many modifications are possible in the embodiments without materially departing from the novel teachings and advantages of embodiments of the invention.

Accordingly, all such modifications are intended to be included within the scope of embodiments of the invention as defined in the claims. Therefore, it is to be understood that the foregoing is illustrative of various embodiments and is not to be construed as limited to the predetermined embodiments disclosed, and that modifications to the disclosed embodiments, as well as other embodiments, are intended to be included within the scope of the appended

What is claimed is:
1. A display device, comprising:
an organic light emitting diode emitting light;

an antireflection layer disposed on the organic light emitting diode and preventing reflection of external light incident from an outside; and a thin film encapsulation layer disposed on the antireflection layer, the thin film encapsulation layer including:
   a first inorganic encapsulation layer disposed directly on the antireflection layer and including silicon nitride;
   a second inorganic encapsulation layer disposed on the first inorganic encapsulation layer;
   an organic encapsulation layer directly disposed on the second inorganic encapsulation layer; and
   a third inorganic encapsulation layer disposed on the organic encapsulation layer,
wherein a thickness of the first inorganic encapsulation layer in a direction perpendicular to a main plane extension direction of the substrate is about 50 angstroms to about 150 angstroms.

2. The display device of claim 1, wherein the antireflection layer includes ytterbium (Yb).

3. The display device of claim 1, wherein the antireflection layer includes bismuth (Bi).

4. The display device of claim 1, wherein the second inorganic encapsulation layer includes silicon oxynitride.

5. The display device of claim 4, wherein the third inorganic encapsulation layer includes silicon nitride.

6. The display device of claim 1, further comprising a substrate on which the organic light emitting diode is disposed,
   wherein a thickness of the second inorganic encapsulation layer is about 9,000 angstroms to about 11,000 angstroms, a thickness of the organic encapsulation layer is about 3 micrometers to about 5 micrometers, and a thickness of the third inorganic encapsulation layer is about 6,000 angstroms to about 8,000 angstroms.

7. The display device of claim 1, wherein the first to third inorganic encapsulation layers are chemical vapor deposition treated layers.

8. The display device of claim 1, further comprising:
   a capping layer disposed between the organic light emitting diode and the antireflection layer.

* * * * *